United States Patent
Subrahmanyan

(10) Patent No.: US 11,092,433 B2
(45) Date of Patent: *Aug. 17, 2021

(54) CONSTRUCTION OF THREE-DIMENSIONAL PROFILES OF HIGH ASPECT RATIO STRUCTURES USING TOP DOWN IMAGING

(71) Applicant: Applied Materials, Inc., Santa Clara, CA (US)

(72) Inventor: Pradeep Subrahmanyan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/872,611

(22) Filed: May 12, 2020

(65) Prior Publication Data

US 2020/0271442 A1 Aug. 27, 2020

Related U.S. Application Data

(63) Continuation of application No. 16/206,246, filed on Nov. 30, 2018, now Pat. No. 10,670,393.

(51) Int. Cl.
*G01B 15/04* (2006.01)
*H01J 37/28* (2006.01)
*G06K 9/46* (2006.01)
*G06K 9/42* (2006.01)

(52) U.S. Cl.
CPC .............. *G01B 15/04* (2013.01); *G06K 9/42* (2013.01); *G06K 9/4604* (2013.01); *H01J 37/28* (2013.01)

(58) Field of Classification Search
CPC ........ G01B 15/04; G06K 9/42; G06K 9/4604; H01J 37/28
USPC .......................... 250/306, 307, 309, 310, 311
See application file for complete search history.

(56) References Cited

U.S. PATENT DOCUMENTS

| | | | |
|---|---|---|---|
| 10,670,393 B1 * | 6/2020 | Subrahmanyan | ....... H01J 37/28 |
| 2007/0229807 A1 | 10/2007 | Lally et al. | |
| 2016/0047017 A1 | 2/2016 | Maki et al. | |
| 2019/0145932 A1 | 5/2019 | Feng et al. | |

* cited by examiner

*Primary Examiner* — Nicole M Ippolito
(74) *Attorney, Agent, or Firm* — Lowenstein Sandler LLP

(57) ABSTRACT

The methods and systems disclosed here detect edges of top-down images of respective cross-sections of an array of high-aspect-ratio (HAR) features. The respective cross sections are at various depths of a HAR feature along a longitudinal direction. The detected edges are re-sampled in a spatial domain at a target angular resolution. The re-sampled edges are represented as a corresponding set of harmonics in a frequency domain, each set of harmonics preserving characteristic information about a respective cross-section of the HAR feature at a certain depth. A plurality of cross-sections at the various depths of the HAR feature are reconstructed by analyzing the corresponding sets of harmonics in the frequency domain. A 3D profile of the HAR feature is generated by stitching the plurality of re-constructed cross-sections at the various depths of the HAR feature.

20 Claims, 13 Drawing Sheets

_US 11,092,433 B2_

CONSTRUCTION OF THREE-DIMENSIONAL PROFILES OF HIGH ASPECT RATIO STRUCTURES USING TOP DOWN IMAGING

CROSS REFERENCE TO RELATED APPLICATIONS

This application is a continuation of U.S. application Ser. No. 16/206,246, filed Nov. 30, 2018, which is incorporated by reference in its entirety herein.

TECHNICAL FIELD

Embodiments of the disclosure relate generally imaging of high aspect ratio (HAR) structures, and specifically to characterization of high aspect ratio structures on a semiconductor wafer or other structure using precision three-dimensional profiles derived from top-down image data.

BACKGROUND

A variety of HAR structures are routinely used in current and next generation semiconductor devices. Features of a HAR structure should be characterized well using detailed metrology to be able to tune the etch process parameters as the etch progresses and the aspect ratio changes.

Existing imaging approaches for metrology, such as scanning electron microscopy (SEM), image features of any structure, including high aspect ratio (HAR) structures, in either lateral or longitudinal planes. Since the HAR structure is sampled only on a single plane, a significant amount of information on the feature is lost. This is akin to significant aliasing given that metrology off a single plane is used to represent a 3-dimensional surface. Imperfect device characteristics gathered from the aliased images impair effective tuning of process parameters. More recently, techniques like Small Angle X-ray Scattering (known as CD-SAXS) are being used for improving device characteristic metrology, but X-ray based techniques do not have the robust, well-established imaging capability that SEMs have.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

The methods and systems disclosed here leverage currently available reliable imaging techniques used by SEMs and use computational methods to synthesize accurate 3D profiles of features of high aspect ratio structures in a device. Radial cross-sectional profiles obtained from different locations at different longitudinal heights/depths are stitched together to create one composite 3D profile of the HAR feature.

Specifically, the methods and systems disclosed here detect edges of top-down images of respective cross-sections of an array of high-aspect-ratio (HAR) features. The respective cross sections are at various depths of a HAR feature along a longitudinal direction. The detected edges are re-sampled in a spatial domain at a target angular resolution. The re-sampled edges are represented as a corresponding set of harmonics in a frequency domain, each set of harmonics preserving characteristic information about a respective cross-section of the HAR feature at a certain depth. A plurality of cross-sections at the various depths of the HAR feature are reconstructed by analyzing the corresponding sets of harmonics in the frequency domain. A 3D profile of the HAR feature is generated by stitching the plurality of re-constructed cross-sections at the various depths of the HAR feature.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
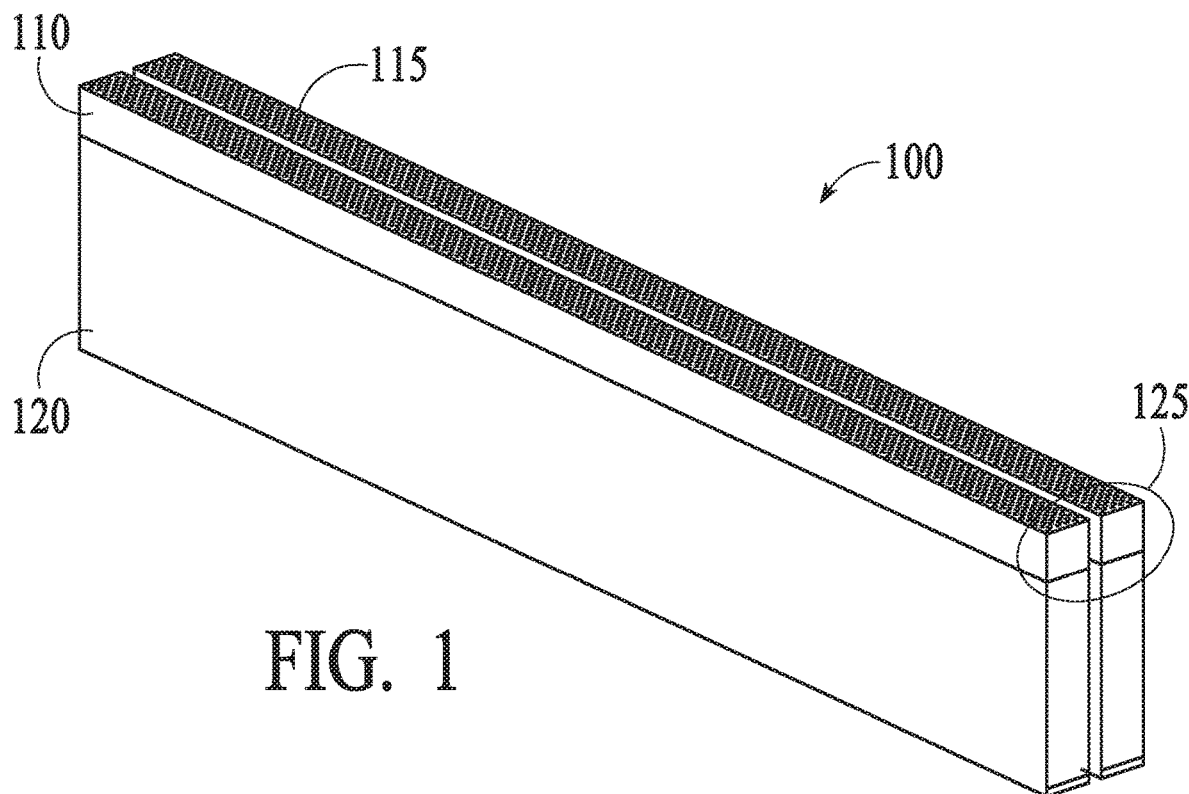
FIG. 1 illustrates a portion of an example device structure with an etched hard mask on top of a multi-layer stack, according to an embodiment of the present disclosure.

Embodiments of the present disclosure are directed to novel, high-resolution techniques to construct three-dimensional profiles of characteristic features of High Aspect Ratio (HAR) structures using Scanning Electron Microscope (SEM) images. HAR structures that are routinely used in current and next generation semiconductor devices, display devices, photovoltaic devices, micro-electro-mechanical systems (MEMS) devices, etc. usually have aspect ratio greater than 1:10, and more typically, in the range of 1:40 to 1:200. However, this disclosure is not limited to any specific aspect ratio. Examples of HAR structures include, but are not limited to, hard masks, contact holes, channel holes, slits, etc. Specific examples include word-line contacts and word-line isolation in three dimensional NOT-AND (3DNAND) logic gate memory devices. Further examples include Dynamic Random Access Memory (DRAM) capacitors.

The HAR features should be characterized well using detailed metrology to be able to tune process parameters as a process (such as an etching process or a deposition process) progresses and the aspect ratio of HAR structures changes. For example, in an etch process, the etch rate varies as the aspect ratio of a feature changes with time. Accurate characterization of HAR features enables effective tuning of the etch process parameters. Current approaches for HAR feature characterization use SEM images along a vertical (or longitudinal) section, and/or transmission electron microscopy (TEM) images. These imaging techniques usually provide only an image of a single planar section from which a limited number of device characterization metrics are obtained. This leads to aliasing in the profile reconstruction of the HAR features. The approach disclosed herein avoids aliasing in reconstructed images by ensuring that the sampling frequency is greater than the Nyquist spatial frequency of the features and provides rapid high resolution metrology using existing SEM imaging techniques.

The present method avoids the problem of aliasing by performing normal top down imaging, and extracting radial cross-sectional geometries at different heights/depths of a HAR feature from an array of structures that are geometrically identical on the mask design, but can vary slightly when actually fabricated on a wafer due to process-induced spatial variation across a wafer or substrate. The radial cross-sectional profiles obtained from different locations at different heights/depths are then stitched together to create one composite 3D profile of the HAR feature. Specifically, embodiments of the present method use a milling tool, such as a Focused Ion Beam (FIB), to generate a test structure (also referred to as a "coupon") to enable sampling of a processed (e.g., after etching) HAR feature in the z-direction. The test structure can be wedge-shaped, or staircase-shaped, or any other shape that allows sampling along the direction of height/depth of the HAR feature being characterized. Another variant can include ion-beam milling and SEM imaging on the same platform with images taken as the milling progresses in the vertical direction. During testing of a process, it can be desirable to utilize sample material in an efficient manner. Therefore, it is common to divide substrate material into smaller units known as coupons. As used herein, coupon will be understood to mean a smaller section of a substrate. A coupon can have all of the properties and functionality as the substrate. For example, if the substrate is a semiconductor wafer with a plurality of devices thereon, then a coupon can be a section of the wafer and may also contain a plurality of the devices.

Advantages of the current method include, but are not limited to: (1) direct extraction of key parameters (such as critical dimension (CD), striations, and tilt) from a set of top-down SEM images of a HAR feature, (2) ability to generate metrology statistics from a large set of image data, and (3) ability to tune process parameters in a reasonably short time. In an illustrative example, the combined operations of etching, creating a wedge-shaped test structure (e.g., by an FIB tool), and performing SEM analysis, enable a user to retune etch process parameters within a time window of tens of minutes. Moreover, top down SEM-based techniques have the potential to eventually be scalable to in-line monitoring. This can be done by either ion-beam milling only a single die on a wafer and imaging that die with a top down SEM or by using the data extracted using this approach as a training data set for use with other non-destructive approaches.

Imaging and metrology of radially symmetric (e.g., circular) HAR features is described in detail in this specification to illustrate the inventive concepts, although those skilled in the art can extrapolate the application of the disclosed technique to other geometries. Examples of other geometries include trenches such as those used for shallow trench isolation of transistors. As a non-limiting specific example, a memory hole of a 3DNAND structure is selected as a demonstrative example of a HAR feature to be synthesized for characterization. However, it should be understood that the techniques described herein below with reference to the 3DNAND structure also apply to any other structure with HAR features.

FIG. 1 shows a portion of an example 3DNAND structure 100 with an etched hard mask 110 on top of a multi-layer stack 120. The hard mask 110 can be a carbon hard mask in an embodiment. The multi-layer stack can be an oxi-nitride (ON) stack in an embodiment. The top surface 115 of the etched hard mask 110 show the top openings of an array of memory holes etched into the structure 100. Each of the memory holes may be a HAR feature. The memory holes are seen more clearly in FIG. 3, which is a close up of the portion 125 of the 3DNAND structure 100 shown within the dash-dotted outline. Note that the accompanying diagrams are not necessarily drawn to scale, but are used to convey the inventive concept visually.

Figure 2:
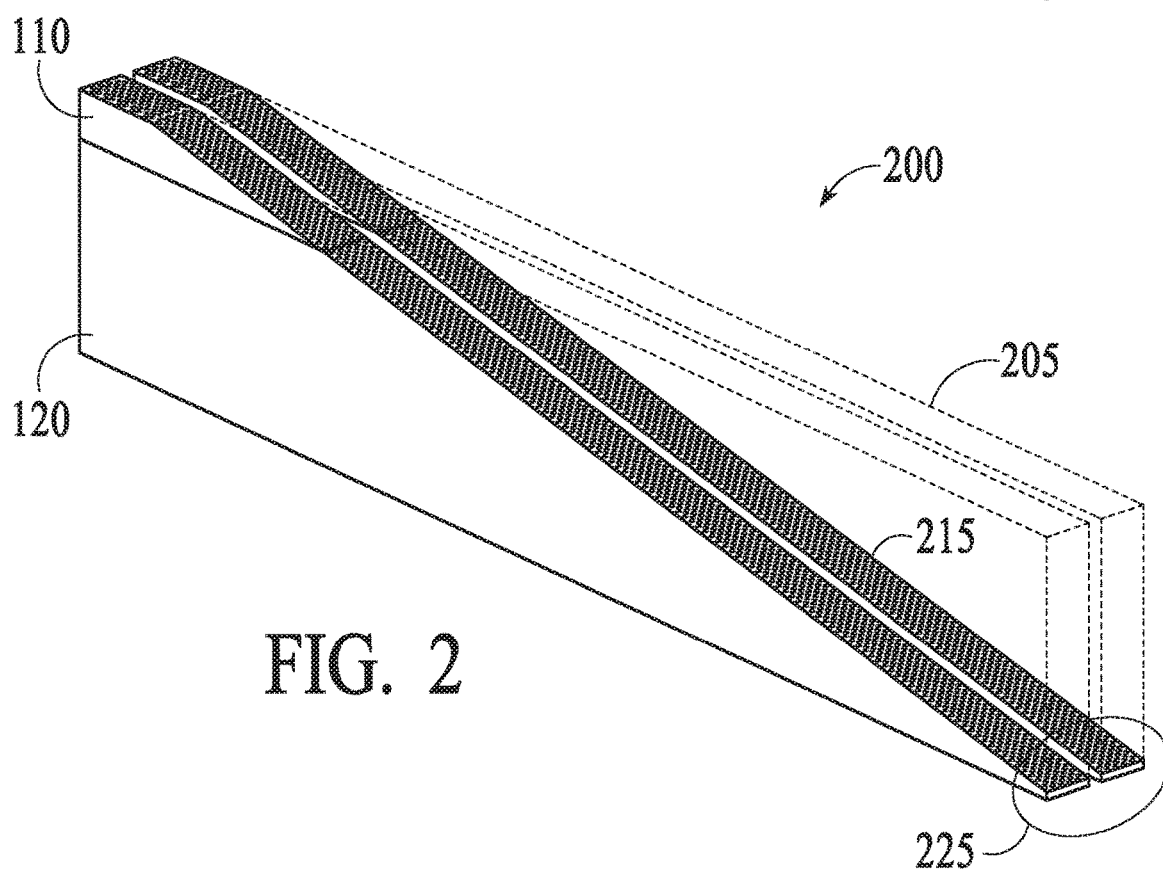
FIG. 2 illustrates a wedge-shaped test structure prepared for vertical sampling of HAR features, according to an embodiment of the present disclosure.

Following the etch process, the 3DNAND structure 100 may be sent to a FIB milling tool to mill a wedge-shaped test structure 200 that lengthwise covers the entire depth of the memory holes through the multi-layer stack. Alternatively, another approach would be to mill a certain predetermined amount in the vertical direction with an ion-beam milling column and without even breaking vacuum move the sample underneath a SEM column and image the sample before going back to the ion-beam column and repeating the process several times until the entire depth of the HAR structure is traversed. The wedge-shaped test structure 200 is illustrated in FIG. 2. Portions 205 shown with dashed lines are removed to expose cross-sections (e.g., radial cross-sections) of the memory holes at different depths along the milled surface 215 of the wedge-shaped test structure 200.

Figure 4:
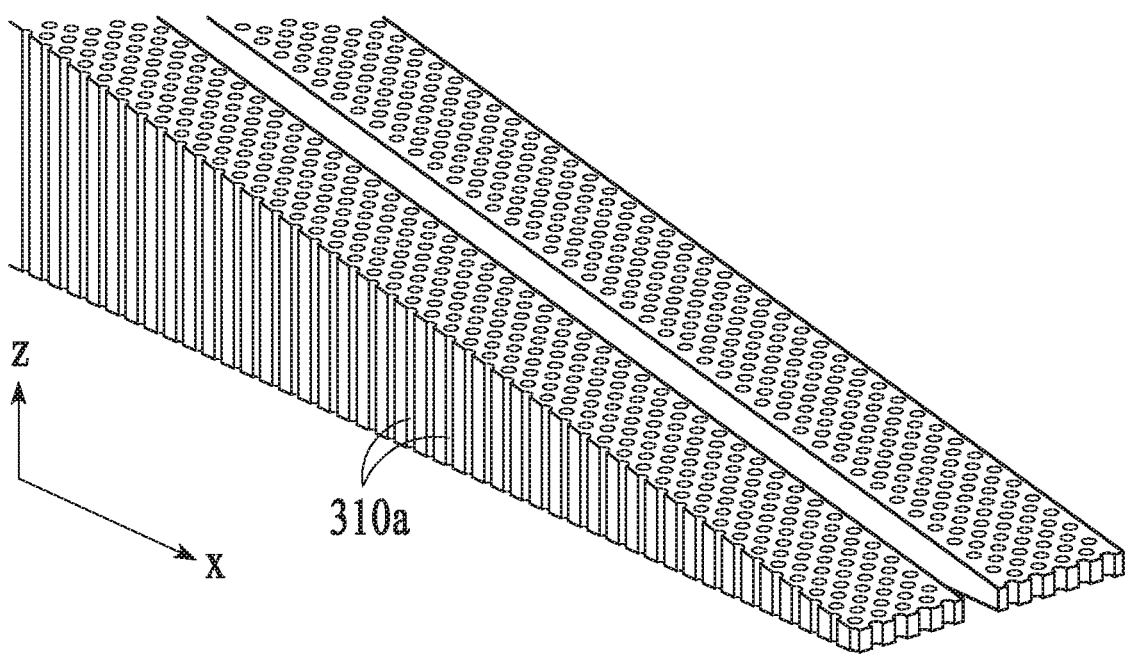
FIG. 4 illustrates a close-up of a portion of the structure in FIG. 2, according to an embodiment of the present disclosure.

The milled memory holes with varying depths are seen more clearly in FIG. 4, which is a close up of the portion 225 of the wedge-shaped test structure 200 shown within the dash-dotted outline.

Note that during FIB milling, an aggressive ion flux can sometimes result in a damage layer being formed on the top of the milled surface 215 (the damage layer is not specifically shown for clarity). The damaged layer can be removed with another pass of the focused ion beams at a lower fluence, if needed.

Figure 3:
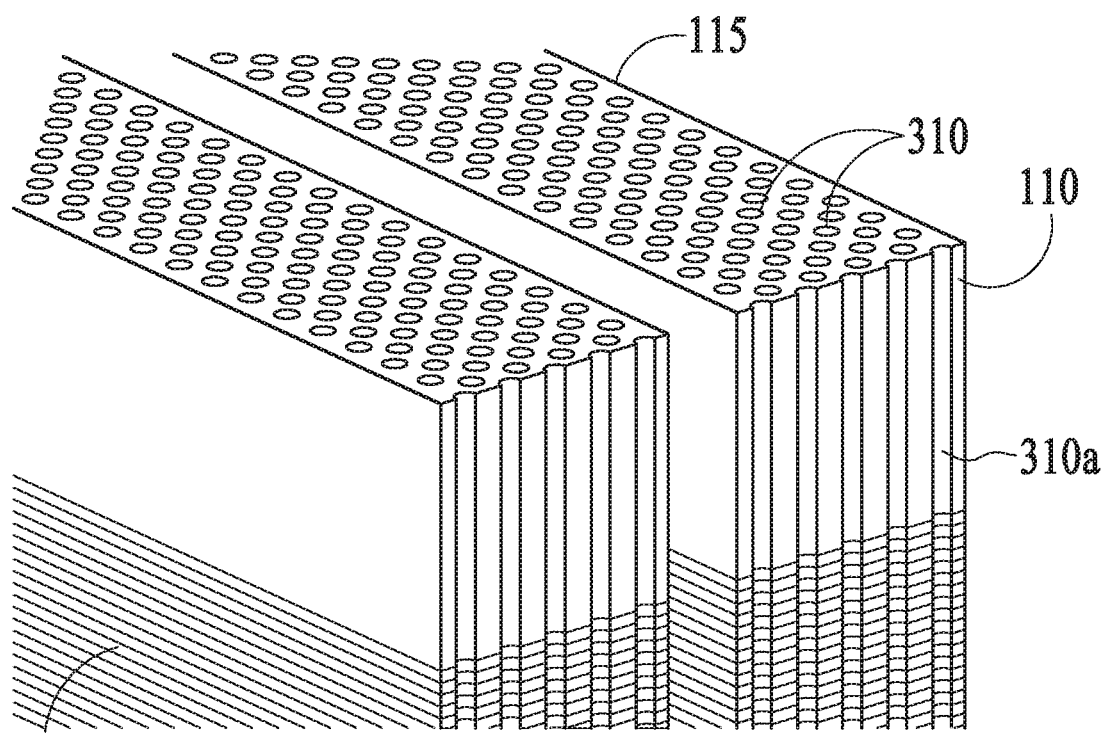
FIG. 3 illustrates a close-up of a portion of the structure in FIG. 1, according to an embodiment of the present disclosure.

FIG. 3 shows a close up of the portion 125 (shown in FIG. 1) of the 3DNAND structure 100 before milling, showing the memory holes 310 more clearly. The memory holes 310 are substantively cylindrical features (i.e. having vertical channels 310a with substantively uniform radial cross-section along the vertical direction, e.g. circular or elliptical cross-sections) etched all the way through the hard mask 110 and the multi-layer stack 120. However, other HAR features may have other cross-sectional shapes. FIG. 4 shows a close up of the end portion 225 of the wedge-shaped test structure 200 created by milling, showing exposed memory hole vertical channels 310a with gradually varying depths.

Figure 5:
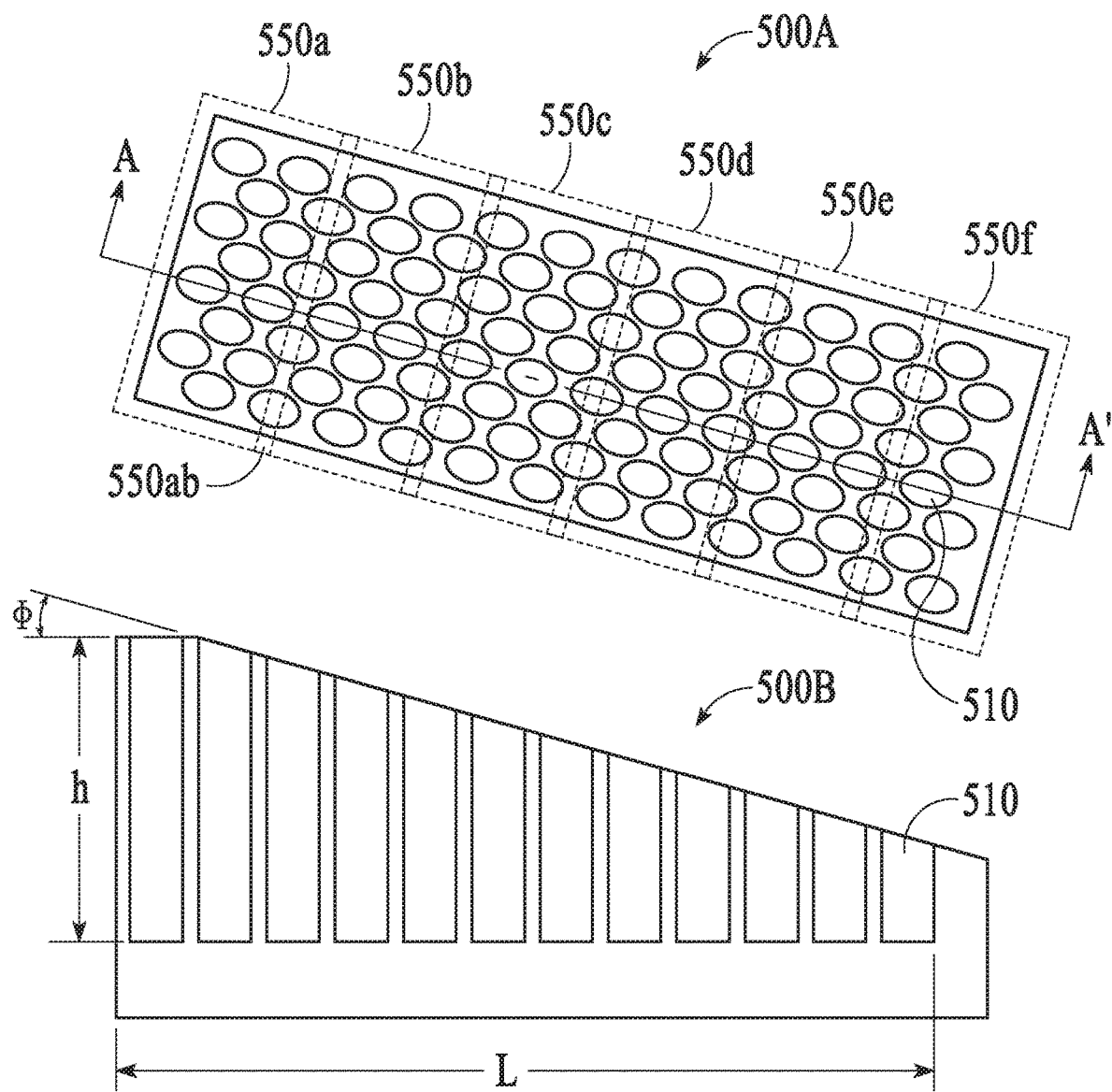
FIG. 5 shows two different views obtained from SEM imaging of the wedge-shaped test structure in FIG. 2, according to an embodiment of the present disclosure.

FIG. 5 shows two different views 500A and 500B obtained by imaging the wedge-shaped test structure 200. Note that although 500A shows one continuous view, the view 500A is created by stitching a number of rectangular fields of view (FOV) 550 of the SEM tool. Each rectangular FOV (e.g., 550a, 550b, 550c, 550d, 550e, 550f) is referred to as a "frame." There can be some overlap between adjacent frames for seamless stitching. For example, frames 550a and 550b overlap in the area 550ab. Each memory hole 310 creates a corresponding elliptical image 510, when imaging is done normal to the milling plane (e.g., FIB plane BB' shown in FIG. 6).

View 500B shows reconstruction of a vertical section profile (along the plane AA') of the wedge-shaped test structure 200. For a milling angle $\Phi$, and a memory hole depth 'h', a swath length 'L' (where L=h/tan $\Phi$) should be covered by the SEM to cover all the memory holes along the x direction. In an example, for a 5 µm deep memory hole (the depth includes about 800 nm of remaining hard mask on top of a multi-layered stack), 5 or 6 FOVs or frames can be stitched to cover a swath length at a resolution of ~2 nm, assuming a 20% overlap between the adjacent frames to obtain good stitching.

Figure 6:
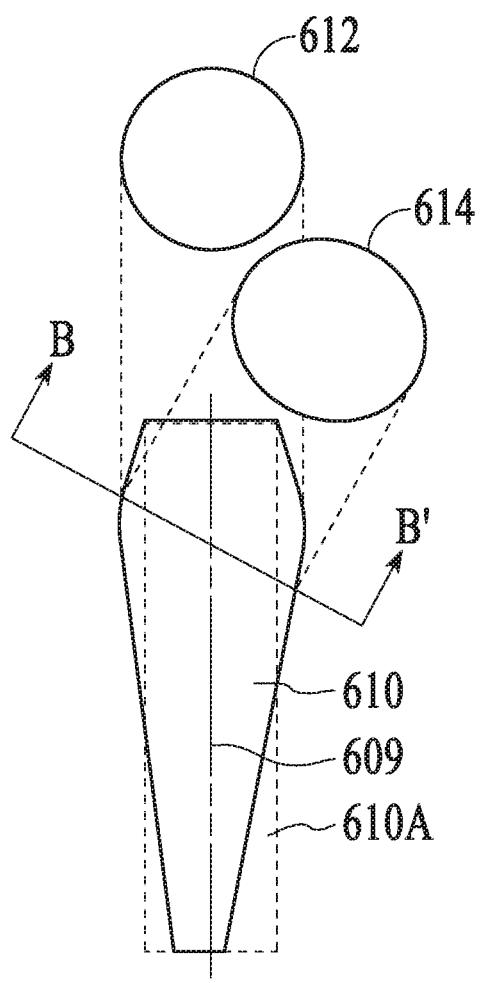
FIG. 6 shows a two-dimensional shape representing a memory hole channel, according to an embodiment of the present disclosure.

FIG. 6 shows a longitudinal two-dimensional shape 610 (in a vertical plane) representing a memory hole channel, which is not necessarily cylindrical. Typically, there is a bow in the memory hole caused by deflected ions during the etch step following which there is a progressive reduction in the diameter of the hole as the aspect ratio increases. FIG. 6 also shows a projection of a radial cross-section of shape 610 onto the wafer plane (i.e. a plane parallel to the plane of the substrate) as well as a projection of the same onto the milling plane (BB'). The milling plane is a plane along which the FIB (or other milling tool) cuts off a portion of the structure 100 to create the wedge-shaped structure 200. A projection of a radial cross-section of the memory hole onto the wafer plane results in a circular image 612 for a top down imaging system with a conventional SEM, while a tilt SEM can obtain an elliptical image 614 (representing image projection onto the milling plane). In case of the later, a shear transformation should be applied to the elliptical image 614 before further image-processing. The shear transformation is a simple homogeneous transformation that is a function of the incidence angle of the electron beams and is not required for the more common case of top-down imaging.

Figure 7:
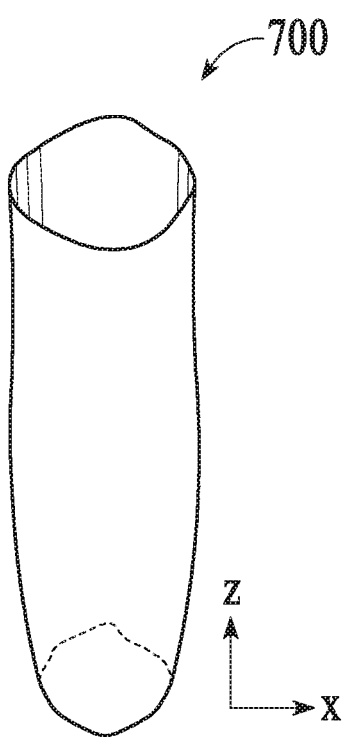
FIG. 7 shows a 3D rendering of a reconstructed profile of a memory hole, according to an embodiment of the present disclosure.
Figure 8A:
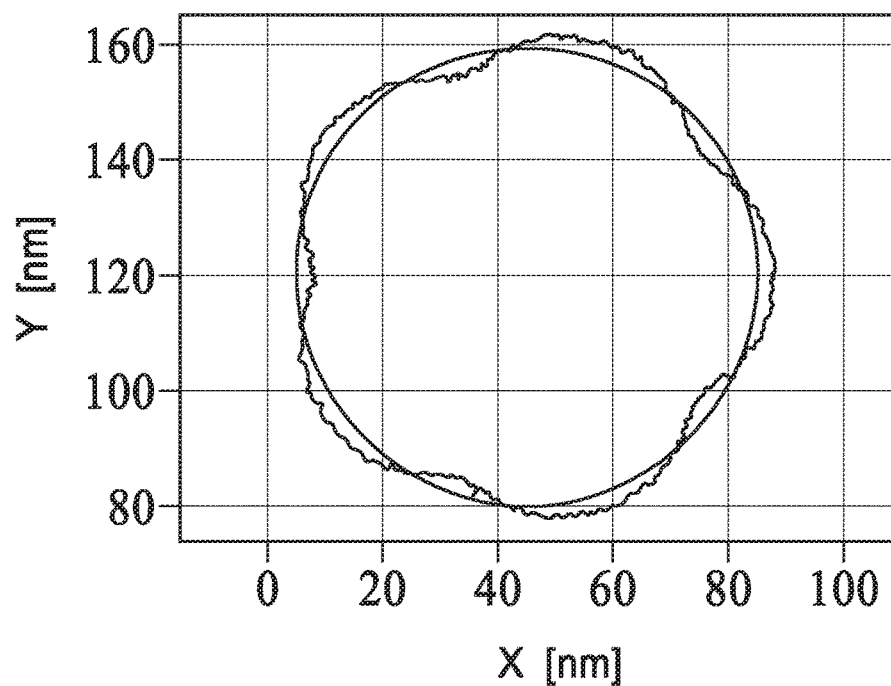
FIGS. 8A-8D show four different radial cross-sections of a memory hole that require increasingly higher order mathematical fits according to an embodiment of the present disclosure.
Figure 8B:
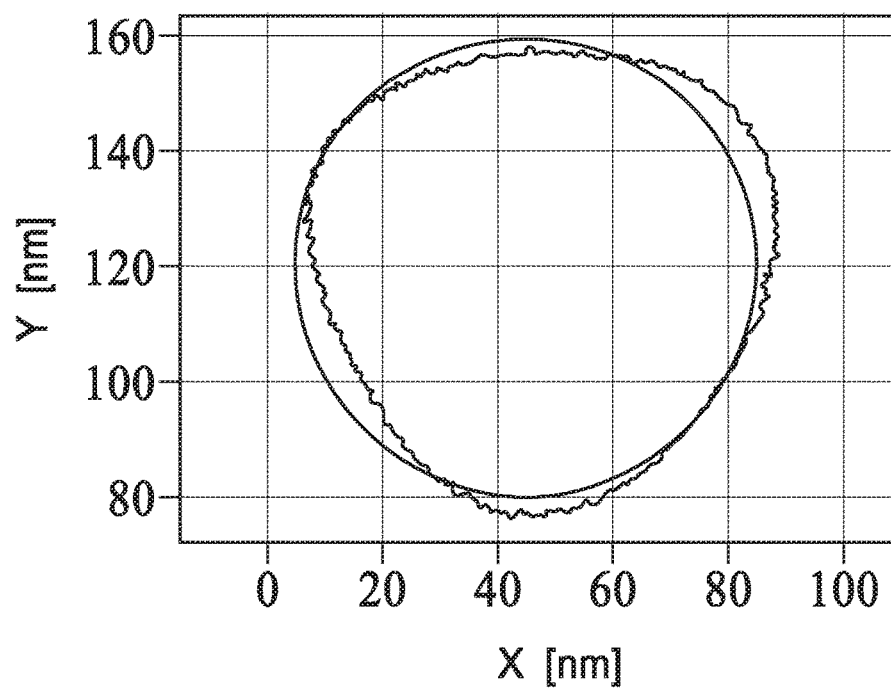
Figure 8C:
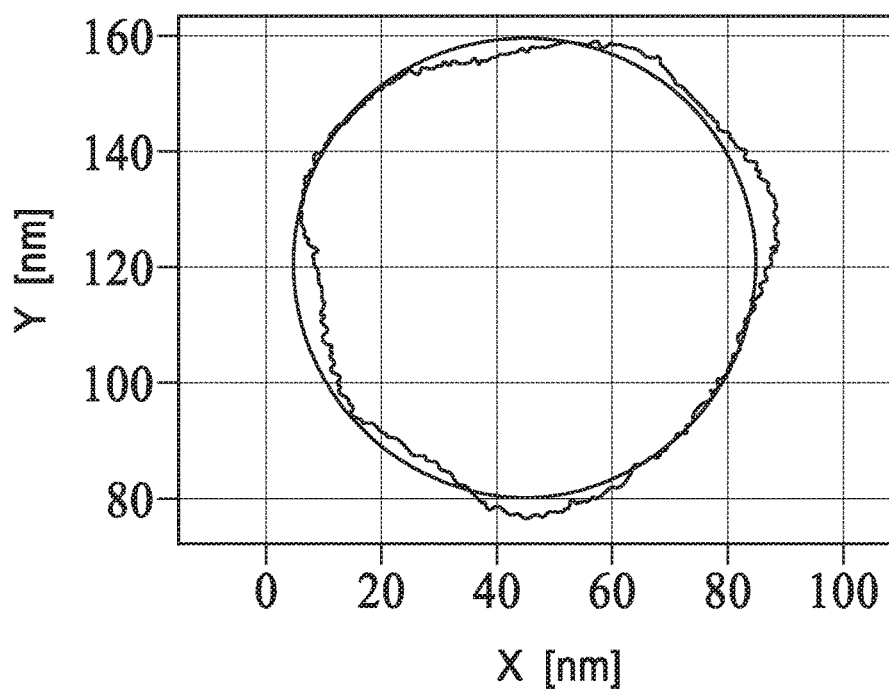
Figure 8D:
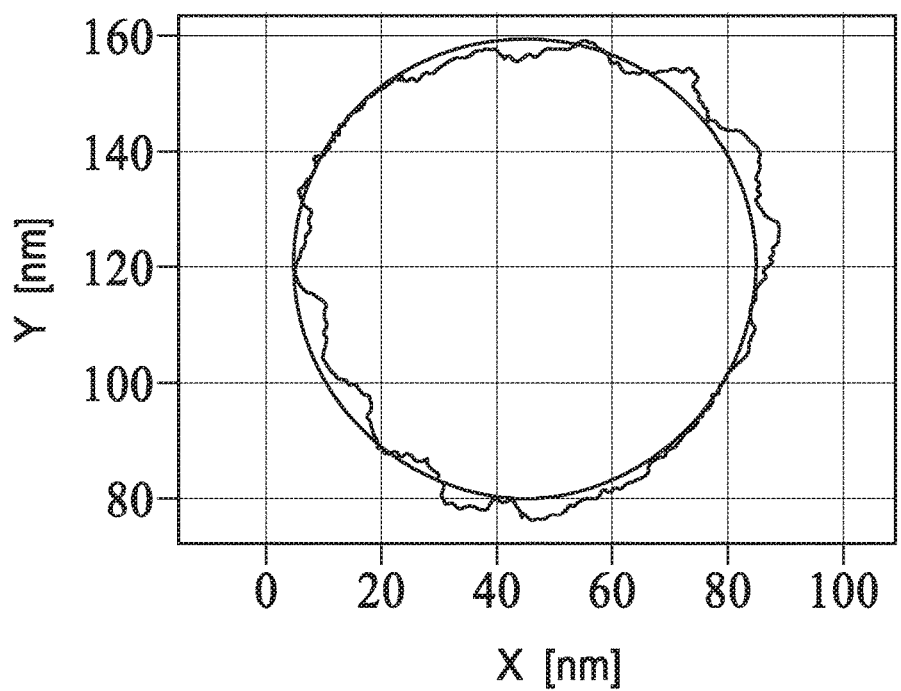

FIG. 7 shows a reconstructed 3D profile 700 of a memory hole. The 3D profile 700 is synthesized by combining different radial cross-sections at various depths (along z-direction) that are obtained from SEM imaging of different memory holes disposed along the x-direction of the wedge-shaped test structure 200. The 3D reconstruction also illustrates one of the pitfalls of using a 2-dimensional cross-section image such as that in FIG. 6. A significant asymmetry of the HAR feature, that can be readily observed from the 3D reconstruction of FIG. 7, is not evident in the 2D construction shown in FIG. 6 as a consequence of the spatial aliasing that was referred to earlier. Details of the 3D profile reconstruction are elaborated further below.

FIGS. 8A-8D show four different radial cross-sections of a memory hole. These cross-sections are chosen to illustrate various shapes that could result from the etching process. Each one of these cross-sections has different harmonic content and a one-size-fits-all approach will lead to poor results. In each of the plots, the perfect circle is the ideal radial cross-section of a memory hole at a given location, and the non-circular enclosed curve is the statistical "best-fit" version of the reconstructed radial cross-section obtained from applying the methods of this disclosure to the SEM images, as described below.

Figure 9:
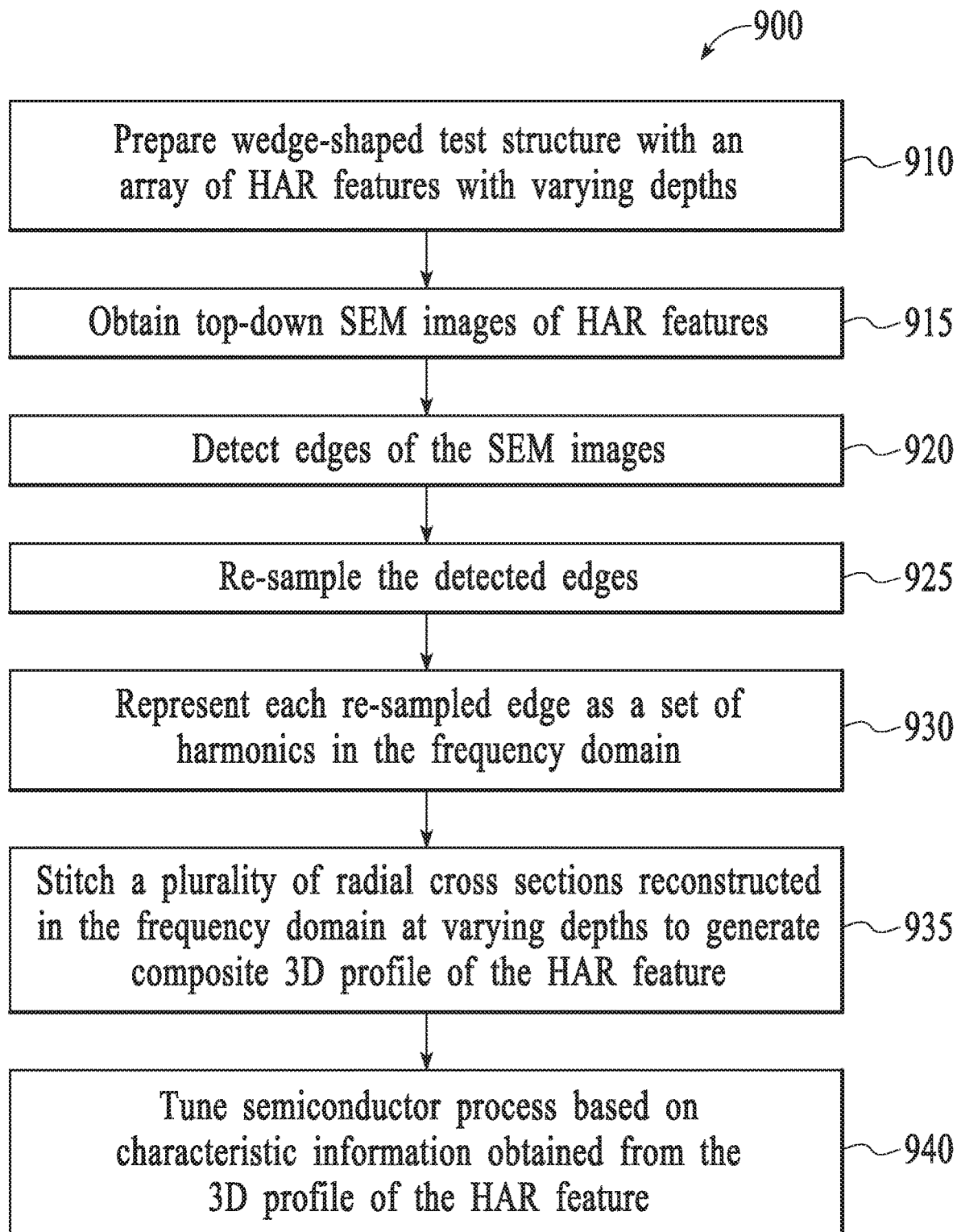
FIG. 9 shows a flowchart depicting a method of reconstructing a 3D profile of a HAR feature, according to an embodiment of the present disclosure.

FIG. 9 is a flow diagram of an example method 900 to reconstruct a 3D profile of a HAR feature, in accordance with some embodiments of the present disclosure. Some of the steps of method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes in method 900 or other methods described below with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method begins at block 910, where a wedge-shaped structure (such as structure 200) is prepared with an array of HAR features (e.g., memory holes) with varying depths. The wedge-shaped test structure can be prepared as described above.

At block 915, SEM images of the HAR features are obtained. In one embodiment, the SEM images represent radial cross-sectional images of the HAR features obtained from the top surface 215 of the wedge-shaped structure 200.

At block 920, edges to each cross-sectional image of a corresponding HAR feature are computed. This can be done using standard image processing routines. One such non-limiting routine uses Sobel or Laplacian operations with additional filtering and suppression. Canny edge detection can also be used to remove speckle noise, detect edges and suppress multiple edge detection in one step.

At block 925, the computed edges are radially re-sampled uniformly around a circumference of the image of the HAR feature. Number of sample points is user-selectable based on the geometry of the HAR feature, as well as the target resolution.

At block 930, the re-sampled edges are represented as a set of harmonics. For this operation, the edge pixels are expressed as a function of angular position, and their spatial (x,y) coordinates are saved. This is done for each HAR feature, e.g., for each memory hole. The spatial coordinates are then computationally transformed into the frequency domain. This transformation can be done by using a Fast Fourier Transform (FFT) that computes a set of harmonics. For a closed geometry (blob), the zero-th harmonic corresponds to the center of the best-fit circle to the blob, the first harmonic corresponds to the radius of the best-fit circle, and the higher order terms illustrate the lack of circularity, i.e. evidence of striations. The formulae to illustrate this decomposition of the (x,y) coordinates of the edges in the frequency domain are as follows:

$$x=x_0+r\cos\theta+\Sigma_{k=2}^n a_k \cos k\theta$$

$$y=y_0+r\sin\theta+\Sigma_{k=2}^n b_k \sin k\theta$$

Here, $(x_0, y_0)$ is the center of the circle, r is the radius, and $a_k$ and $b_k$ are the coefficients of the higher-order harmonic terms. In the example shown in FIG. 8A, the center of the specific memory hole is (45 nm, 120 nm), the radius is 40 nm (corresponding to a critical dimension (CD) of 80 nm which is equal to the diameter of the memory hole), and the amplitude of the fifth harmonic is 8 nm. FIGS. 8A-8D show the best fit to the ideal circle using different combinations of higher-order harmonics used to represent circularity of the HAR feature.

Existing methods define circularity based on a ratio of area and a square of the perimeter (known as "area/perimeter$^2$ ratio"), or, a ratio of major axis and minor axis. Each of these definitions has their limitations. The major axis/minor axis ratio method only predicts accurate circularity for perfectly elliptical geometries. The area/perimeter$^2$ ratio method loses information about local variation along the edges. In this disclosure, circularity is defined as the ratio between the root mean square summation of higher order harmonic terms and the fundamental harmonic, i.e., radius.

Figure 10:
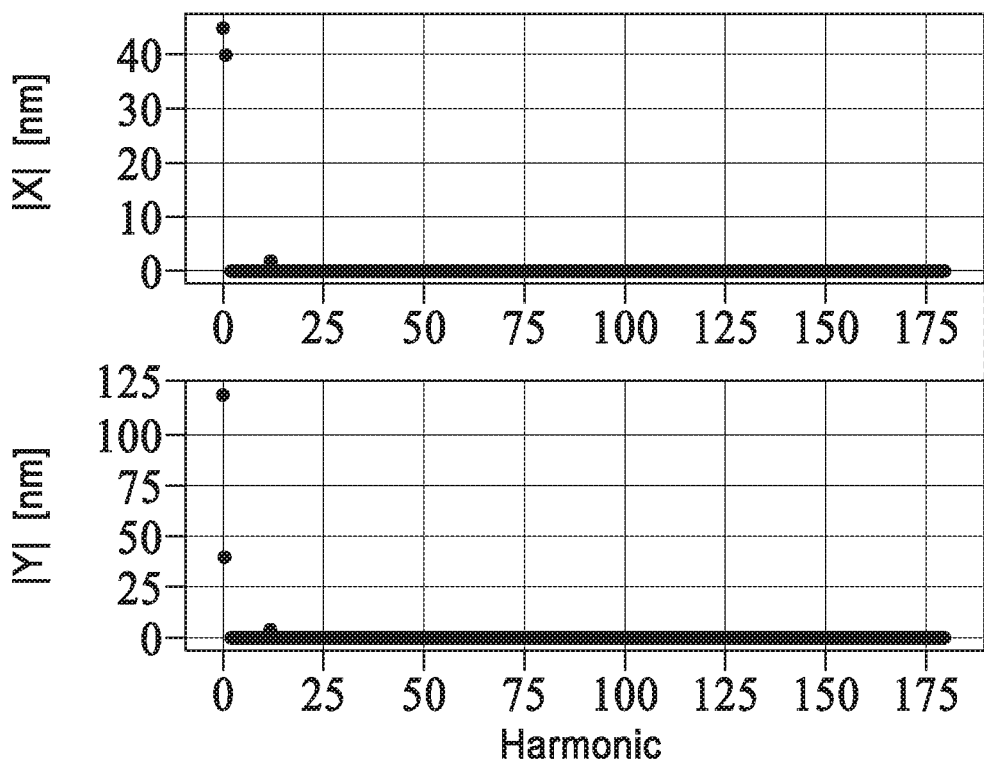
FIG. 10 illustrates harmonic analysis of data obtained from a single slice after the FFT, according to an embodiment of the present disclosure.
Figure 11:
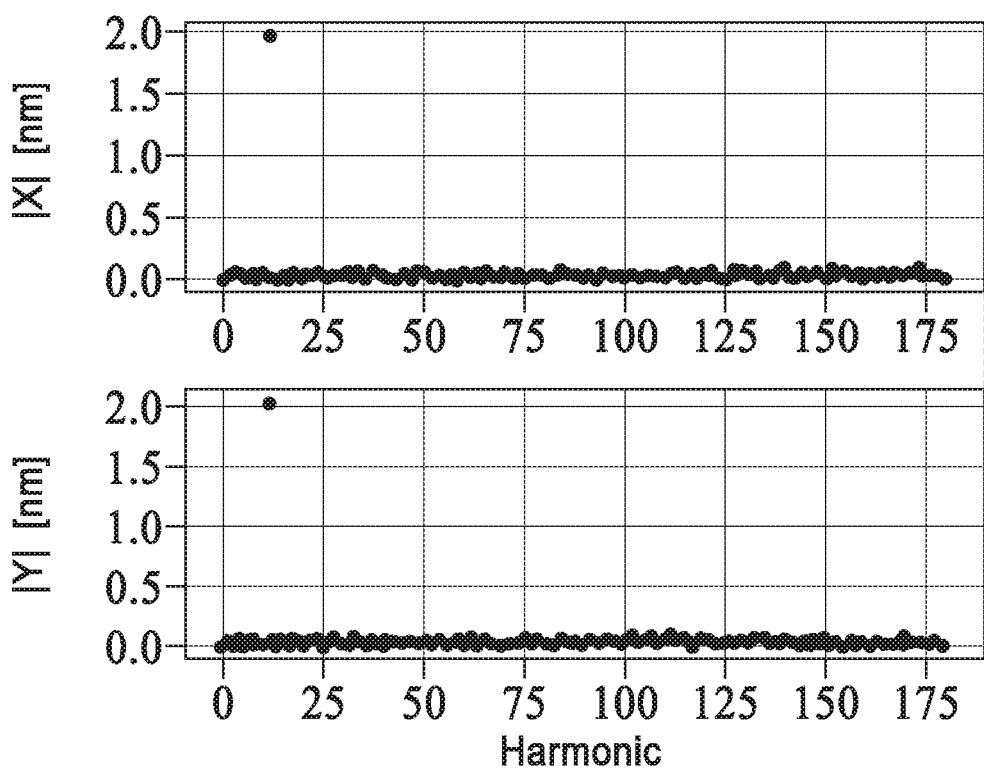
FIG. 11 illustrates the spectrogram where the zeroth and first harmonic components are filtered out, according to an embodiment of the present disclosure.

At block 935, a plurality of radial cross-sectional profiles at varying depths are stitched to generate a composite 3D profile, such as profile 700 shown in FIG. 7. The stitching is based on harmonic analysis of image data in the frequency domain instead of conventional image stitching that is done in the spatial domain. FIG. 10 illustrates harmonic analysis of data obtained from a single slice after the FFT. The top curve in FIG. 10 shows post-FFT spectrogram amplitude of edge data for the x-coordinate, and the bottom curve in FIG. 10 shows post-FFT spectrogram amplitude of edge data for the y-coordinate. Note that edge data refers to raw image data available from the edge pixels during top-down SEM imaging. As mentioned above, some of the key metrics of the memory hole, such as location of the center, CD and circularity, can be computed from the harmonic information in the FFT. The plots shown in FIG. 10 correspond to a memory hole with center at a (x,y) coordinate of (40 nm, 120 nm) and a radius of 40 nm (making the CD 80 nm). FIG. 11 illustrates the spectrogram (as shown in FIG. 10) replotted when the zeroth harmonic (i.e. the center of the circle) and the first harmonic (the radius of the circle) components are filtered out, showing more prominently which higher-order harmonic term contributes the most in correctly predicting the edge contour.

Figure 12:
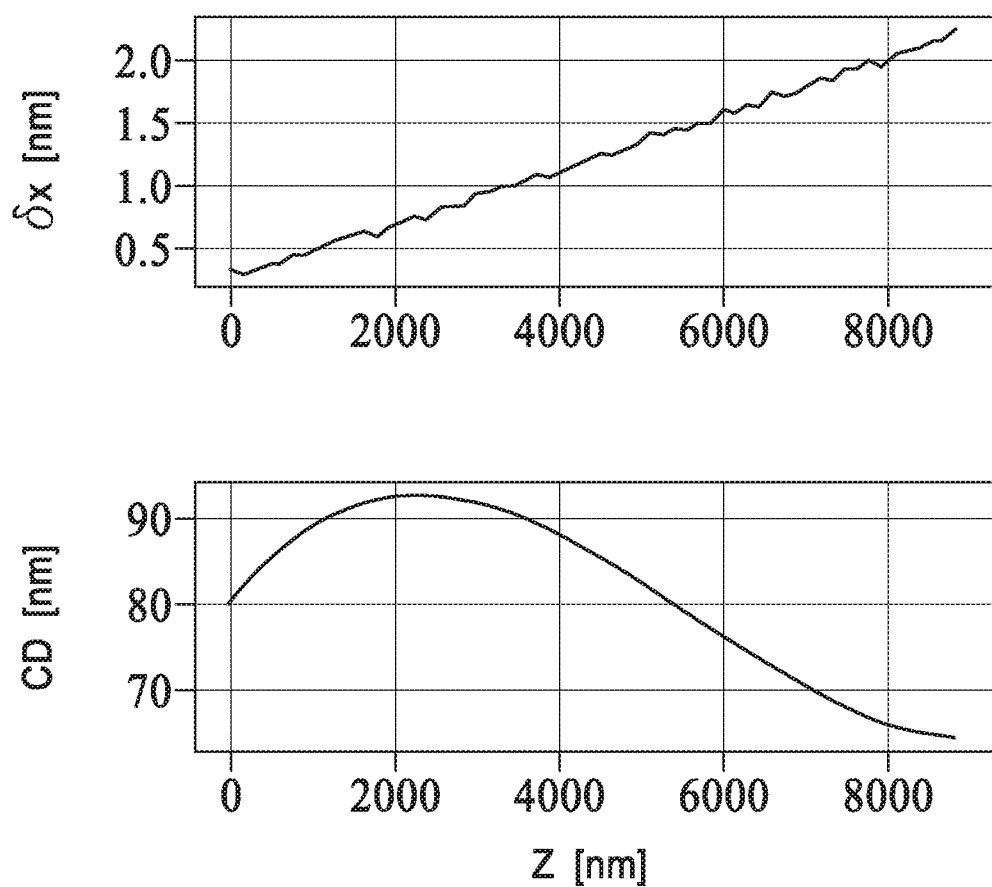
FIG. 12 shows the evolution of 6$x$ and critical dimension (CD) with depth in the z-direction, according to an embodiment of the present disclosure.

It should be noted that each image from the SEM corresponds to a particular depth of the memory hole as exposed by the milling. As a result, it is possible to assemble metrics for the center, CD and circularity as a function of depth. These metrics along the depth direction can be assembled to recreate the original memory hole profile or other HAR feature profile (e.g., a composite profile like what is shown in FIG. 7). Evolution of certain metrics (δx, CD and striation amplitude) with depth are plotted as two-dimensional charts in FIGS. 12 and 13. The top curve in FIG. 12 shows the evolution of δx in the z-direction (δx being the deviation of the center of the memory hole form the ideal center in the x-direction), and the bottom curve shows the evolution of CD in the z-direction. The plots in FIG. 12 illustrate linear tilt in the x-direction and a typically observable bow in such HAR structures.

Figure 13:
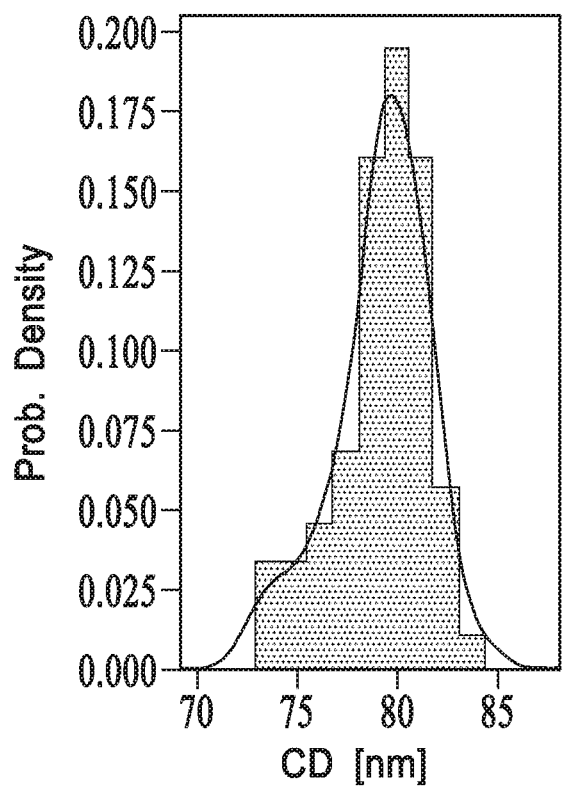
FIG. 13 plots the probability density of CD, according to an embodiment of the present disclosure.
Figure 14:
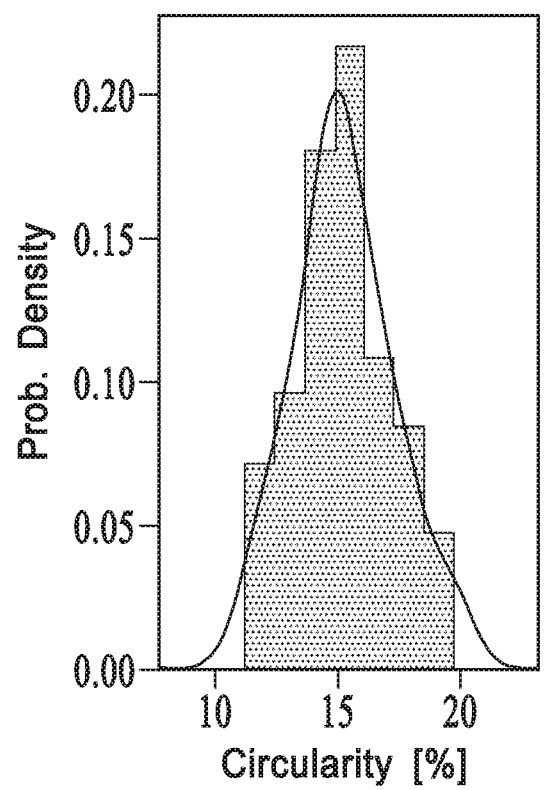
FIG. 14 plots the probability density of circularity, according to an embodiment of the present disclosure.
Figure 15:
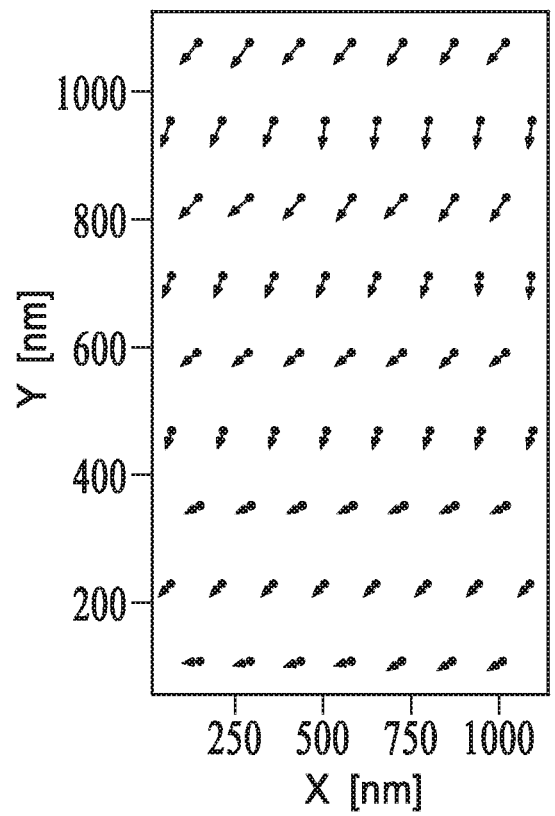
FIG. 15 shows at a certain depth, the tilt of a memory hole varies spatially in the x-y plane, with the arrows representing both the magnitude and direction of the tilt according to an embodiment of the present disclosure.

FIGS. 13, 14 and 15 plot real data from an etched memory hole. This data is obtained from the memory hole exposed at a certain depth because of the milling. Specifically, SEM images of a memory hole are obtained and "blobs" are detected using standard image processing algorithms for blob detection. Edges are detected on the identified blobs and following a resampling process, FFTs are computed as a first step for harmonic-analysis based stitching. Following stitching, various parameters are estimated for the various blobs. Histograms are assembled for various groups of blobs (e.g., by image frame, by cell position, by z-depth) following which probability densities for geometric parameters such as CD and circularity are computed. The plots in FIGS. 13 and 14, respectively, show such probability densities for CD and circularity when the blobs are grouped by image frames. As noted above, circularity is defined as the ratio between the root mean square summation of higher order harmonic terms and the fundamental zeroth order harmonic, i.e., radius. The deviation of the centroid of the blobs from the target position at a certain depth is illustrated in FIG. 15. These deviations can then be assembled together in the Z-direction to show the tilt of the various holes. The tilt of a memory hole varies spatially in the x-y plane, with the arrows in FIG. 15 representing both the magnitude and direction of the tilt.

The nominal values of metrics (e.g., CD, circularity, and possibly additional metrics) as well as the statistical distributions for the metrics for all the memory holes in a Field of View (FOV) of the SEM are analyzed. The process is repeated for multiple images, each image obtained at a different depth.

Figure 16:
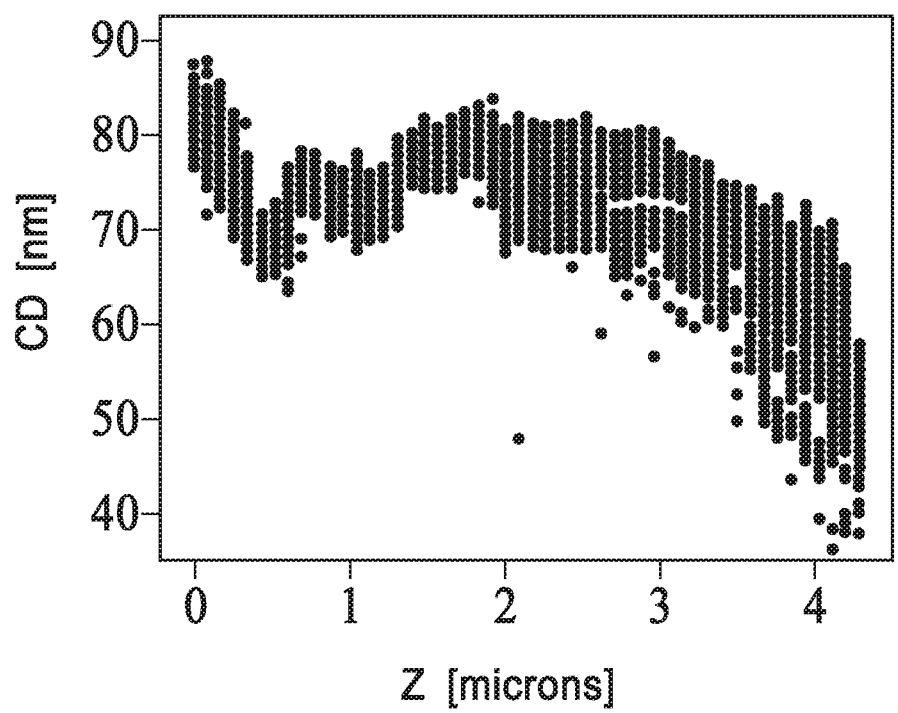
FIG. 16 shows raw data obtained from individual blobs for CD, according to an embodiment of the present disclosure.
Figure 17:
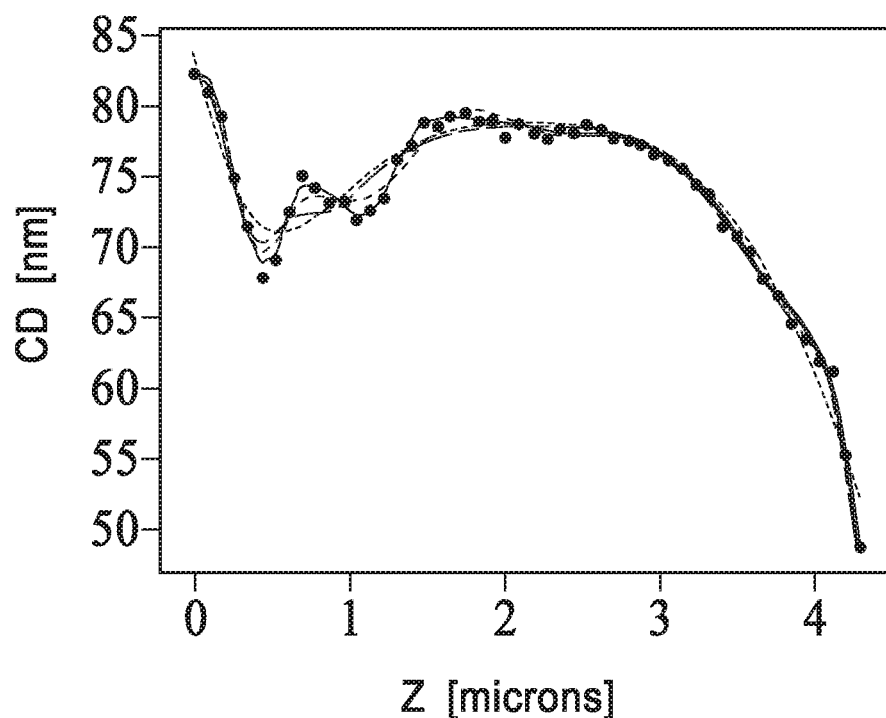
FIG. 17 shows filtered data using smoothing operations (also referred to as smoothening operations), according to an embodiment of the present disclosure.
Figure 18:
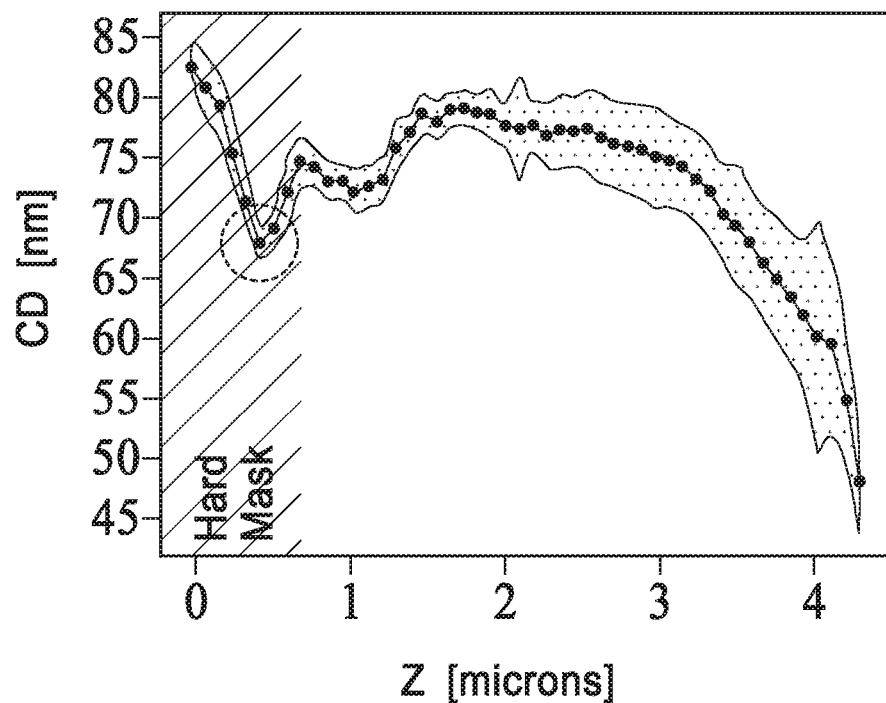
FIG. 18 shows both the nominal value and the confidence interval of CD, according to an embodiment of the present disclosure.
Figure 19:
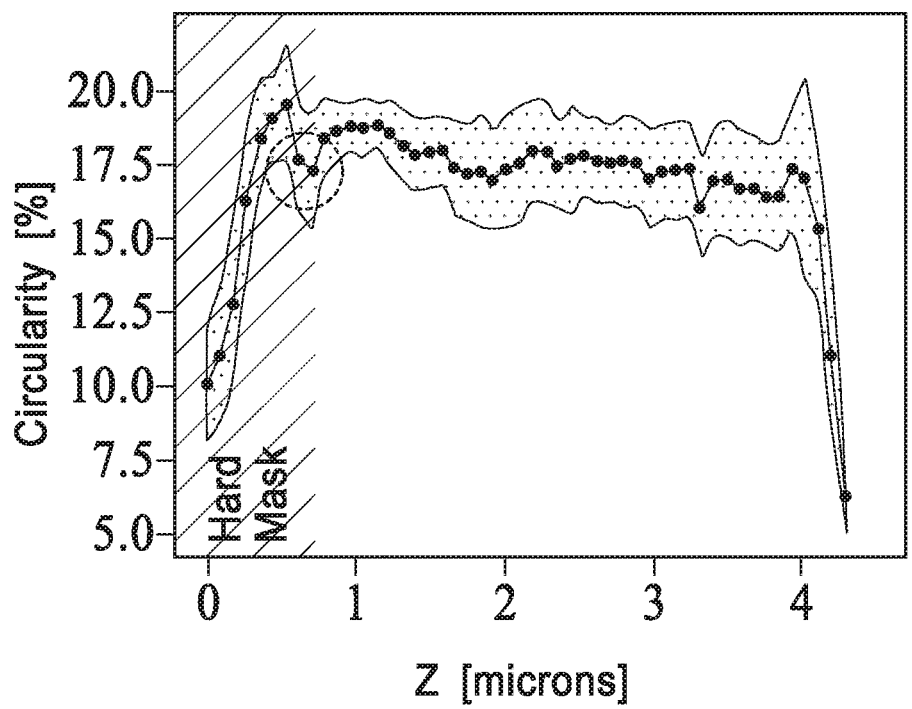
FIG. 19 shows both the nominal value and the confidence interval of circularity, according to an embodiment of the present disclosure.

The images are then assembled together and the combined data from all the images is plotted as a function of depth, as shown in FIGS. 16-19. Specifically, FIG. 16 shows raw data obtained from individual blobs for CD, and FIG. 17 shows filtered data using smoothing operations (also referred to as smoothening operations). The smoothing operation can use non uniform rational B-splines (NURBs) to create seamless stitching of image data for different depths obtained from different FOVs or frames while preserving information about a radial cross-sectional profile computed using the higher-order harmonics, as described above. The smoothing operation can also be carried out using conventional filtering approaches. Smoothing or filtering the harmonic coefficients in the z-direction is done to account for the hole-to-hole variability within an array of memory holes in synthesizing one composite memory hole that represents all the memory holes being considered. FIGS. 18 and 19 show both the nominal value and the 1σ confidence interval (the shaded area around the plot, indicating standard deviation) of CD and circularity, respectively, plotted together to give a complete statistical picture of the performance of an etch recipe. In these plots, the dip (known as "necking", shown within a dashed circle) at the interface of the hard mask and the multi-layer stack is prominently visible. As shown in FIG. 19, circularity is almost held constant throughout the etching process. If there is any lack of circularity in the memory holes in the hard mask, that lack of circularity is propagated through the depth of the multi-layer stack.

Once the composite 3D profile is created, method 900 optionally proceeds to block 940. At block 940, the reconstructed HAR represented by the 3D profile is characterized, and the characteristic information is used to tune a semiconductor process. For example, an etch process parameters can be tuned to offset the effects of variation of etch rate with changing aspect ratio.

Figure 20:
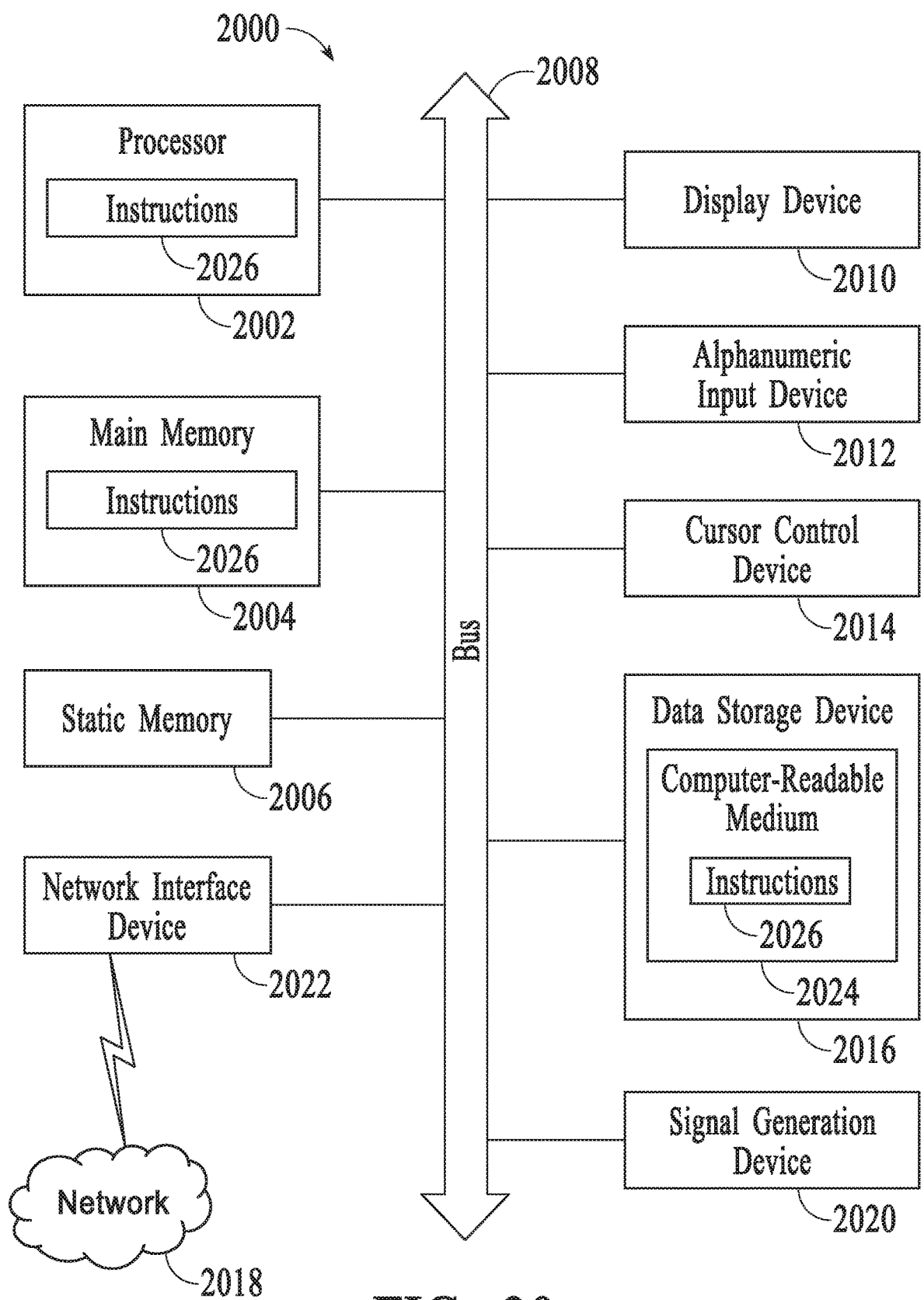
FIG. 20 shows a system environment where embodiments of the present disclosure can be practiced.

FIG. 20 illustrates an example machine of a computer system 2000 within which a set of instructions, for causing the machine to perform any one or more of the methodologies discussed herein, can be executed. In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2000 includes a processing device 2002, a main memory 2004 (e.g., read-only memory (ROM), flash memory, dynamic random access memory (DRAM) such as synchronous DRAM (SDRAM) etc.), a static memory 2006 (e.g., flash memory, static random access memory (SRAM), etc.), and a data storage device 2016, which communicate with each other via a bus 2008.

The processing device 2002 comprises a graphics processing unit (GPU) for manipulating SEM images. In addition, the processing device 2002 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 2002 can also be one or more special-purpose processing devices such as an application specific integrated circuit (ASIC), a field programmable gate array (FPGA), a digital signal processor (DSP), network processor, or the like. The processing device 2002 is configured to execute instructions for performing the operations and steps discussed herein.

The computer system 2000 can further include a network interface device 2022 to communicate over the network 2018. The computer system 2000 also can include a video display unit 2010 (e.g., a liquid crystal display (LCD) or a cathode ray tube (CRT)), an alphanumeric input device 2012 (e.g., a keyboard), a cursor control device 2014 (e.g., a mouse or a touch pad), a signal generation device 2020 (e.g., a speaker), a graphics processing unit (not shown), video processing unit (not shown), and audio processing unit (not shown).

The data storage device 2016 can include a machine-readable storage medium 2024 (also known as a computer-readable medium) on which is stored one or more sets of instructions or software embodying any one or more of the methodologies or functions described herein. The instructions can also reside, completely or at least partially, within the main memory 2004 and/or within the processing device 2002 during execution thereof by the computer system 2000, the main memory 2004 and the processing device 2002 also constituting machine-readable storage media.

In one implementation, the instructions include instructions to implement functionality corresponding to a height difference determination. While the machine-readable storage medium 2024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a targeted result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "obtaining" or "determining" or "detecting" or "generating" or "representing" or "creating" or "using" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A computer-implemented method comprising:
   detecting edges of top-down images of respective cross-sections of an array of high-aspect-ratio (HAR) features, wherein the respective cross sections are at various depths of a HAR feature along a longitudinal direction;
   re-sampling the detected edges in a spatial domain at a target angular resolution;
   representing the re-sampled edges as a corresponding set of harmonics in a frequency domain, each set of harmonics preserving characteristic information about a respective cross-section of the HAR feature at a certain depth, wherein the set of harmonics is obtained by performing Fast Fourier Transform (FFT) on the re-sampled edges;
   reconstructing a plurality of cross-sections at the various depths of the HAR feature by analyzing the corresponding sets of harmonics in the frequency domain; and
   generating a three-dimensional (3D) profile of the HAR feature by stitching the plurality of cross-sections that are reconstructed at the various depths of the HAR feature.

2. The method of claim 1, wherein the stitching comprises parametric stitching based on the preserved characteristic information about each cross-section of the plurality of cross-sections.

3. The method of claim 1, wherein the method further comprises:
   prior to detecting edges of top-down images,
   obtaining a coupon comprising a plurality of high-aspect-ratio (HAR) features creating the array, each HAR feature of the array having substantially identical initial depth;
   preparing a test structure for vertical sampling along a direction of depth of the HAR features by removing a portion of the coupon to create variation in depth of the HAR features from a maximum value to a minimum value; and
   obtaining the top-down images by a scanning electron microscope (SEM).

4. The method of claim 3, wherein preparing the test structure for vertical sampling comprises:
   using a focused ion beam to create a wedge-shaped test structure, where the maximum value is the initial depth of the HAR feature, and the minimum value is substantially close to zero.

5. The method of claim 3, wherein generating the three-dimensional profile of a HAR feature further comprises:
   smoothing out coefficients of the sets of harmonics in the longitudinal direction to account for variability within the plurality of HAR features, such that the three-dimensional profile is a composite that represents the plurality of HAR features.

6. The method of claim 5, wherein the smoothing out of the 3D profile is performed using non-uniform rational B-splines.

7. The method of claim 1, wherein the HAR feature is a vertical hole with an opening at a top surface and having a substantially circular cross-section.

8. The method of claim 7, wherein the preserved characteristic information comprises planar coordinates of a location of a center of the vertical hole being represented by a zero-eth order harmonic of the set of harmonics.

9. The method of claim 7, wherein the preserved characteristic information comprises a radius of the vertical hole being represented by a first-order harmonic of the set of harmonics.

10. The method of claim 7, wherein the preserved characteristic information comprises circularity of the vertical hole at a certain depth, the circularity being represented by a ratio of a radius of the vertical hole and a summation of higher-order harmonic terms.

11. The method of claim 3, wherein the method further comprises:
    prior to re-sampling, applying shear transformation to the edges detected along a tilted cutting plane created by removing a portion of the coupon.

12. The method of claim 1, wherein the target angular resolution of re-sampling is user-selectable based on a geometry of the HAR feature.

13. A system comprising:
    a memory; and
    a processing device operatively coupled with the memory, to:
    detect edges of top-down images of respective cross-sections of an array of high-aspect-ratio (HAR) features, wherein the respective cross sections are at various depths of a HAR feature along a longitudinal direction;
    re-sample the detected edges in a spatial domain at a target angular resolution;
    represent the re-sampled edges as a corresponding set of harmonics in a frequency domain, each set of harmonics preserving characteristic information about a respective cross-section of the HAR feature at a certain depth, wherein the set of harmonics is obtained by performing Fast Fourier Transform (FFT) on the re-sampled edges;

reconstruct a plurality of cross-sections at the various depths of the HAR feature by analyzing the corresponding sets of harmonics in the frequency domain; and generate a three-dimensional (3D) profile of the HAR feature by stitching the plurality of cross-sections that are reconstructed at the various depths of the HAR feature.

14. The system of claim 13, wherein the top-down images are obtained using scanning electron microscope (SEM) from a test structure prepared for vertical sampling along the longitudinal direction.

15. The system of claim 13, wherein the processing device comprises a graphics processing unit capable of rendering a composite 3D image.

16. The system of claim 1, wherein the stitching comprises parametric stitching based on the preserved characteristic information about each cross-section of the plurality of cross-sections.

17. A non-transitory computer readable medium comprising instructions, which when executed by a processing device, cause the processing device to perform operations comprising:

detecting edges of top-down images of respective cross-sections of an array of high-aspect-ratio (HAR) features, wherein the respective cross sections are at various depths of a HAR feature along a longitudinal direction;

re-sampling the detected edges in a spatial domain at a target angular resolution;

representing the re-sampled edges as a corresponding set of harmonics in a frequency domain, each set of harmonics preserving characteristic information about a respective cross-section of the HAR feature at a certain depth, wherein the set of harmonics is obtained by performing Fast Fourier Transform (FFT) on the re-sampled edges;

reconstructing a plurality of cross-sections at the various depths of the HAR feature by analyzing the corresponding sets of harmonics in the frequency domain; and generating a three-dimensional (3D) profile of the HAR feature by stitching the plurality of cross-sections that are reconstructed at the various depths of the HAR feature.

18. The non-transitory computer readable medium of claim 17, wherein the stitching comprises parametric stitching based on the preserved characteristic information about each cross-section of the plurality of cross-sections.

19. The non-transitory computer readable medium of claim 17, wherein the top-down images are obtained using scanning electron microscope (SEM) from a test structure prepared for vertical sampling along the longitudinal direction.

20. The non-transitory computer readable medium of claim 17, wherein the HAR feature is a vertical hole, and the preserved characteristic information comprises planar coordinates of a location of a center of the vertical hole being represented by a zero-eth order harmonic of the set of harmonics, and a radius of the vertical hole being represented by a first-order harmonic of the set of harmonics.

* * * * *